(12) United States Patent
Hsieh et al.

(10) Patent No.: US 11,543,753 B2
(45) Date of Patent: Jan. 3, 2023

(54) TUNABLE ILLUMINATOR FOR LITHOGRAPHY SYSTEMS

(71) Applicant: TAIWAN SEMICONDUCTOR MANUFACTURING CO., LTD., Hsinchu (TW)

(72) Inventors: Ken-Hsien Hsieh, Taipei (TW); Shih-Ming Chang, Hsinchu County (TW); Wen Lo, Taipei (TW); Wei-Shuo Su, Hsinchu (TW); Hua-Tai Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/886,509

(22) Filed: May 28, 2020

(65) Prior Publication Data
US 2021/0132504 A1 May 6, 2021

Related U.S. Application Data

(60) Provisional application No. 62/928,236, filed on Oct. 30, 2019.

(51) Int. Cl.
*G03F 7/20* (2006.01)

(52) U.S. Cl.
CPC .......... *G03F 7/70116* (2013.01); *G03F 7/702* (2013.01); *G03F 7/70166* (2013.01)

(58) Field of Classification Search
CPC .......... G03F 7/702; G03F 7/70058; G03F 7/70066; G03F 7/70075; G03F 7/70083; G03F 7/70091; G03F 7/70116; G03F 7/70125; G03F 7/70141; G03F 7/7015;
(Continued)

(56) References Cited

U.S. PATENT DOCUMENTS

| 8,764,995 B2 | 7/2014 | Chang et al. |
| 8,796,666 B1 | 8/2014 | Huang et al. |
| 8,828,625 B2 | 9/2014 | Lu et al. |

(Continued)

FOREIGN PATENT DOCUMENTS

| DE | 102013204546 A1 | 9/2014 |
| DE | 102015209175 A1 | 11/2016 |

(Continued)

*Primary Examiner* — Christina A Riddle
(74) *Attorney, Agent, or Firm* — Maschoff Brennan (57) ABSTRACT

In one example, an apparatus includes an extreme ultraviolet illumination source and an illuminator. The extreme ultraviolet illumination source is arranged to generate a beam of extreme ultraviolet illumination to pattern a resist layer on a substrate. The illuminator is arranged to direct the beam of extreme ultraviolet illumination onto a surface of a photomask. In one example, the illuminator includes a field facet mirror and a pupil facet mirror. The field facet mirror includes a first plurality of facets arranged to split the beam of extreme ultraviolet illumination into a plurality of light channels. The pupil facet mirror includes a second plurality of facets arranged to direct the plurality of light channels onto the surface of the photomask. The distribution of the second plurality of facets is denser at a periphery of the pupil facet mirror than at a center of the pupil facet mirror.

20 Claims, 4 Drawing Sheets

(58) Field of Classification Search
CPC ............ G03F 7/70166; G03F 7/70191; G03F 7/70208; G03F 7/70283
USPC ..... 355/52–55, 67–71, 77; 250/492.1, 492.2, 250/492.22, 492.23, 493.1; 359/627, 850, 359/851, 857–859, 862–863, 868
See application file for complete search history.

(56) References Cited

U.S. PATENT DOCUMENTS

| | | |
|---|---|---|
| 8,841,047 B2 | 9/2014 | Yu et al. |
| 8,877,409 B2 | 11/2014 | Hsu et al. |
| 9,093,530 B2 | 7/2015 | Huang et al. |
| 9,184,054 B1 | 11/2015 | Huang et al. |
| 9,256,123 B2 | 2/2016 | Shih et al. |
| 9,529,268 B2 | 12/2016 | Chang et al. |
| 9,548,303 B2 | 1/2017 | Lee et al. |
| 2003/0002022 A1* | 1/2003 | Schultz ............ G02B 17/0621 355/67 |
| 2006/0208206 A1* | 9/2006 | Hainz ................. G21K 1/02 250/493.1 |
| 2008/0049291 A1* | 2/2008 | Baek ................. G02B 17/002 359/227 |
| 2008/0225387 A1 | 9/2008 | Hainz et al. |
| 2011/0164233 A1* | 7/2011 | Staicu ............... G03F 7/70108 355/77 |
| 2012/0044474 A1* | 2/2012 | Hauf ................. G02B 26/0816 355/67 |
| 2013/0250265 A1* | 9/2013 | Bienert ................. G03F 7/701 355/71 |
| 2013/0265560 A1 | 10/2013 | Dinger et al. |
| 2014/0368920 A1* | 12/2014 | Jayapala ............... G02B 26/08 359/627 |
| 2015/0277233 A1* | 10/2015 | Van Schoot ........ H01F 7/0231 355/67 |
| 2016/0187784 A1* | 6/2016 | Patra ................. G03F 7/70075 355/67 |
| 2017/0160643 A1 | 6/2017 | Endres et al. |

FOREIGN PATENT DOCUMENTS

| | | |
|---|---|---|
| KR | 20110070881 A | 6/2011 |
| KR | 20130102078 A | 9/2013 |
| KR | 20150070341 A | 6/2015 |
| KR | 20160054579 A | 5/2016 |
| KR | 20180008494 A | 1/2018 |
| TW | 201423283 A | 6/2014 |
| TW | 201610607 A | 3/2016 |
| WO | 2012041720 A2 | 4/2012 |
| WO | 2014060170 A1 | 4/2014 |
| WO | WO-2016184743 A1 * | 11/2016 .......... G03F 7/70116 |

\* cited by examiner

TUNABLE ILLUMINATOR FOR LITHOGRAPHY SYSTEMS

CROSS REFERENCE TO RELATED APPLICATIONS

This application claims the benefit of U.S. Provisional Patent Application Ser. No. 62/928,236, filed Oct. 30, 2019, which is herein incorporated by reference in its entirety.

BACKGROUND

Extreme ultraviolet (EUV) lithography is an optical lithography technique in which the scanner uses light in the extreme ultraviolet region (e.g., spanning wavelengths of approximately one to one hundred nanometers). A light source is configured to emit EUV radiation. For instance, the light source may vaporize a molten metal such as tin into a highly ionized plasma that emits the EUV radiation. The EUV radiation is subsequently guided, using a series of optics (e.g., including multilayer mirrors), into the scanner. In the scanner, the EUV radiation is used to project a pattern, which is etched into a photomask, onto a semiconductor wafer. The EUV process can be used to fabricate a high resolution pattern of features onto the semiconductor wafer, potentially at a scale of seven nanometers or beyond.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In one example, the present disclosure provides a tunable illuminator for lithography systems, including extreme ultraviolet (EUV) lithography systems. As discussed above, an EUV lithography system may use EUV radiation to project a pattern formed in a photomask onto a semiconductor wafer, and the pattern may then be etched into the wafer. The EUV process can be used to fabricate a high resolution pattern of features onto the semiconductor wafer, potentially at a scale of seven nanometers or beyond for the features' critical dimensions. The critical dimensions may be controlled by controlling the exposure energy of the lithography system (which varies the size of the feature dimensions) and the depth of focus (DOF) at the semiconductor wafer. Together, the exposure energy and the DOF may define a process window during which features having the critical dimensions may be printed on the semiconductor wafer.

One technique that has emerged as an effective way to increase the process window for lithography systems is freeform source optimization. Freeform source optimization involves modifying the intensity of each source pixel, so that a flexible, freeform source shape can be defined for each layer of the semiconductor wafer that is being printed. However, in EUV lithography systems (which typically have more complex illumination systems than non-EUV lithography systems), design limitations of the illuminator make it more challenging to adjust the intensity of the source pixels to achieve effective freeform source optimization.

Examples of the present disclosure provide a tunable illuminator for lithography systems, including EUV lithography systems. In one example, the tunable illuminator includes a pupil facet mirror whose facets are arranged in a grid pattern. The cells of the grid (e.g., the facets) vary in size and shape, and the distribution of the cells over the grid is similarly non-uniform. In one particular example, the density of the cells at the outer edges of the grid pattern (e.g., at the outer edges of the pupil facet mirror) is greater than the density of the cells at the center of the grid pattern (e.g., at the center of the pupil facet mirror).

Within the context of the present disclosure, the "effective area" of a projection lens is understood to refer to the area of the projection lens in which a target feature pitch can be resolved. In other words, to resolve the target feature pitch, the light from the illuminator should be angled to be incident upon the projection lens in the effective area. The effective area varies with the size of the target feature pitch. Typically, as the target feature pitch shrinks, so does the effective area (although the relationship between the pitch and the effective area is not necessarily linear).

In one example, the illuminator of the present disclosure may be arranged to illuminate the effective area using off-axis illumination (OAI). In this case, the light directed by the illuminator onto the photomask is incident upon the photomask at a direction that is not normal to the surface of the photomask (i.e., an angle between the beam of light and the photomask surface is oblique). In turn, the diffraction pattern of the photomask shifts within the objective of the projection lens. When the photomask grating has a periodic or regular shape, the photomask's diffraction pattern comprises a plurality of diffraction orders (e.g., points of light) into which the light may be split. The smaller the pitch of the grating, the fewer the number of diffraction orders that passes through the projection lens.

Figure 1:
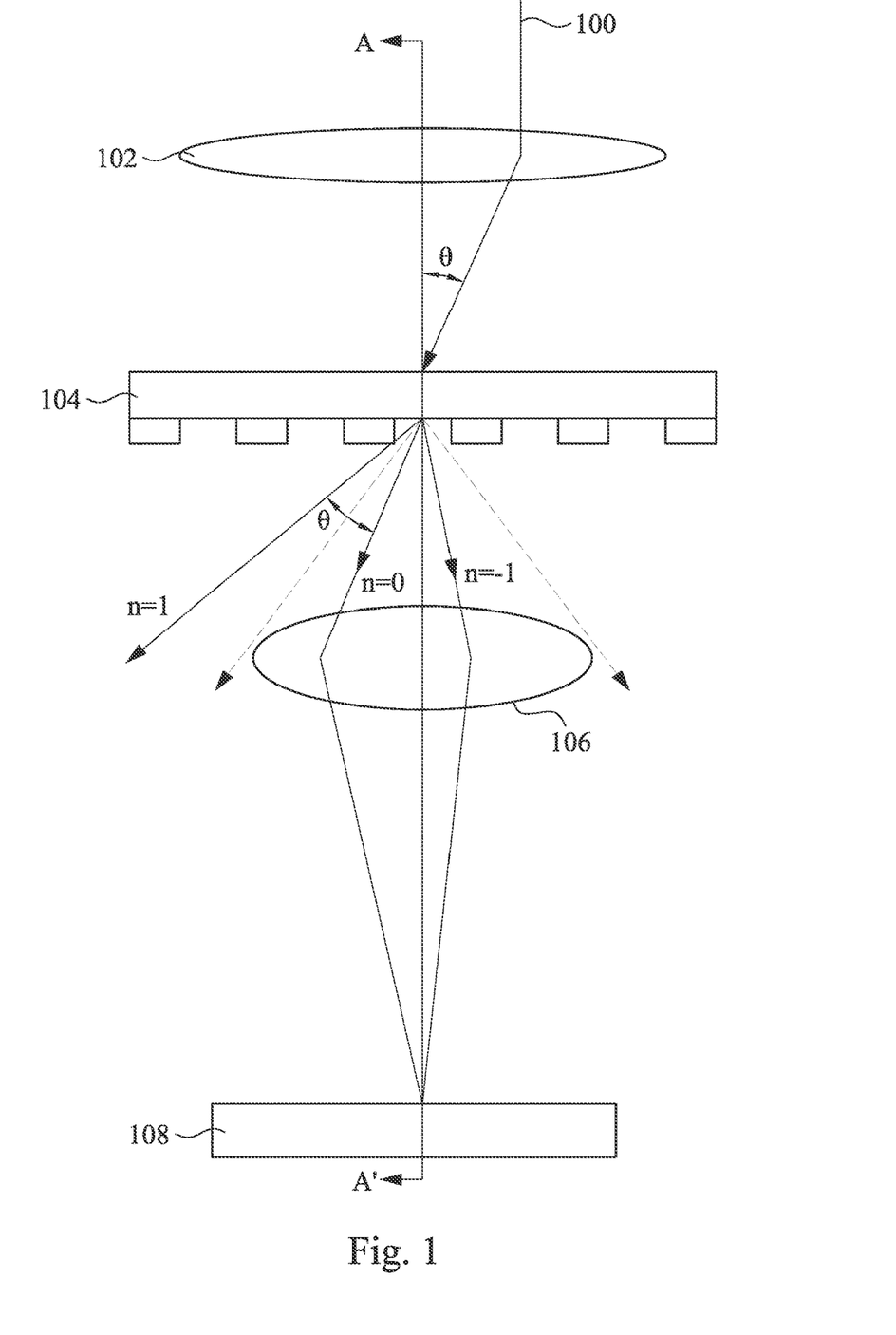
FIG. 1 illustrates the concept of off-axis illumination as employed in examples of the present disclosure.

FIG. 1, for instance, illustrates the concept of off-axis illumination as employed in examples of the present disclosure. As illustrated, a beam of light 100 may be directed from an illuminator 102 and onto a surface of a photomask 104. The angle θ at which the beam of light 100 is incident upon the surface of the photomask 104 may be oblique (i.e., non-parallel to an imaginary line A-A' that is normal to the surface of the photomask 104). As a result, the −1, 0, and +1 diffraction orders (n) pass through the photomask 104; however, only the 0 and −1 diffraction orders are incident upon (and, thus, collected by) the projection lens 106. The light from the 0 and the −1 diffraction orders subsequently interfere with each other to form a steady image on the semiconductor wafer 108. Other (higher) diffraction orders may exist (e.g., +2, −2, +3, −3, and so on), but may be lost due to the size limits of the optical system.

By contrast, if the beam of light 100 struck the photomask 104 at an angle of ninety degrees relative to the photomask surface (e.g., such that the beam of light 100 was parallel to the line A-A'), then all of the diffraction orders would be shifted equally in a manner that brings the 0 diffraction order parallel to the line A-A'. As a result, the +1 and −1 diffraction orders might not be collected by the projection lens 106 (e.g., both of the +1 and −1 diffraction orders would fall outside the area of the projection lens 106, as illustrated by the dashed lines in FIG. 1).

When the beam of light 100 strikes the photomask 104 at an angle of θ, the angle between adjacent diffraction orders (e.g., between the −1 and 0 order, and between the 0 and +1 order) is equal to the angle θ. Typically, the greater the value of θ (and, more specifically, the larger the angle between the adjacent diffraction orders), the greater the number of source points that is formed at the edges of the projection lens 106. Thus, as θ increases, so does the illumination of the projection lens's effective area. As a result, smaller pitch features can be printed on the semiconductor wafer 108. Put another way, the larger the angle between the adjacent diffraction orders that are collected by the projection lens 106, the smaller the features that can be printed on the semiconductor wafer 108. This relationship may be quantified by:

$$\sin\theta = \frac{n \times \lambda}{\text{pitch}} \quad \text{(EQN. 1)}$$

where n is the diffraction order and λ is the wavelength of the light that is incident upon the photomask 104.

Thus, OAI may be employed in examples of the present disclosure to enhance the resolution of the patterns that are printed onto semiconductor wafers under given numerical apertures (NAs) for the projection optics. The NA may be defined by the convergent angle between the projection lens and the semiconductor wafer. For instance, NA may be defined as:

$$NA = r \times \sin\theta \quad \text{(EQN. 2)}$$

Where r represents the refractive index between the final projection lens and the semiconductor wafer (e.g., r=1 for air, 1.43 for water immersion, etc.). Thus, NA represents the ability of the projection lens 106 to collect diffracted light.

To achieve the finest resolution (e.g., the smallest pitch) using OAI, the maximum incident angle between the illuminator and the photomask would be determined by the NA value. In a lithographic system having the photomask 4× larger than the semiconductor wafer image, the NA of the illuminator would be equal to the NA of the projection lens divided by four. Generally, the higher the NA if the projection lens 106, the bigger the projection lens 106 is, the better the resolution of the features that can be printed is, and the lower the DoF of the projection optics.

Additional features can be added to the illuminator disclosed herein. Some of the features described below can also be replaced or eliminated for different examples. Although some examples disclosed below discuss operations that are performed in a particular order, these operations may be performed in other orders as well without departing from the scope of the present disclosure.

Moreover, the illuminator and methods disclosed herein may be deployed in a plurality of applications, including the fabrication of fin-type field effect transistors (finFETs). For instance, examples of the present disclosure may be well suited for patterning the fins of a finFET to produce a relatively close spacing between features. In further examples, spacers used in forming the fins of the finFET may be processed according to examples of the present disclosure.

Figure 2:
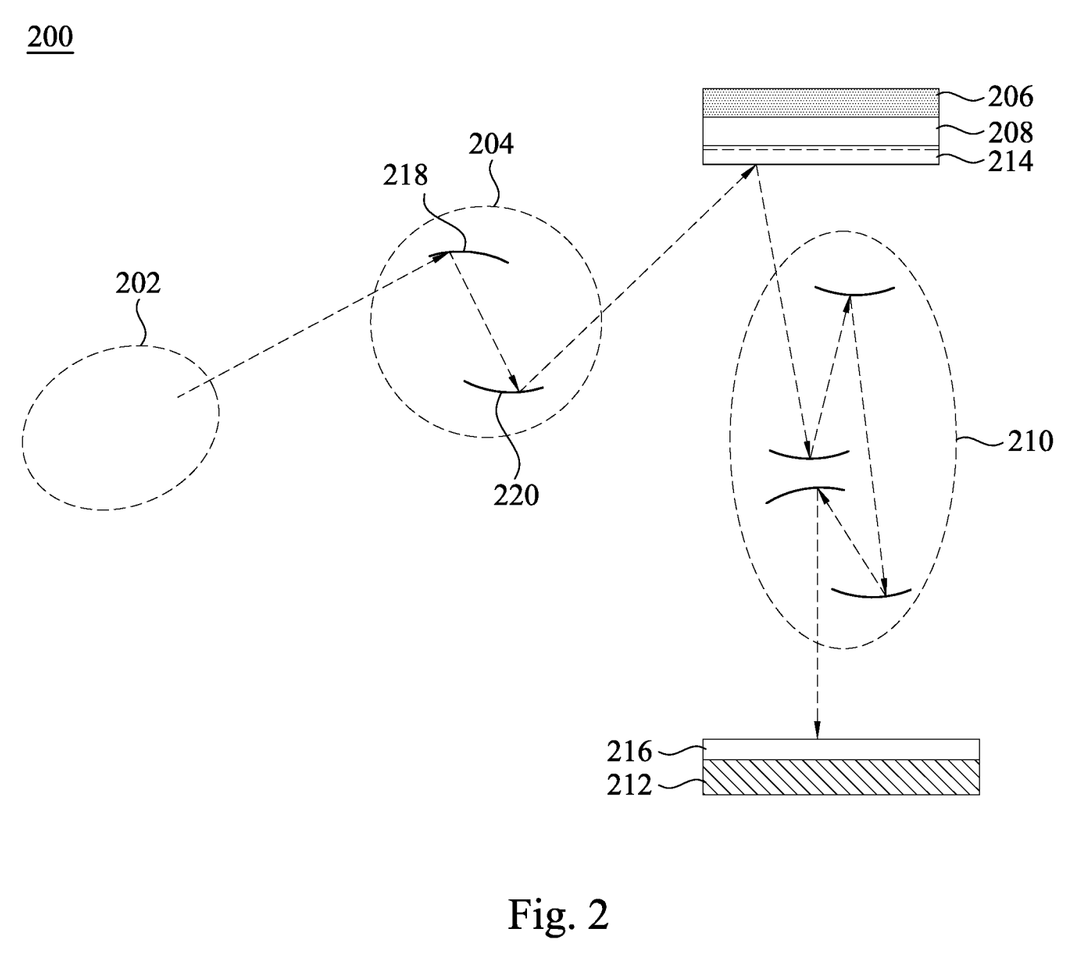
FIG. 2 is a simplified schematic diagram of an example lithography system, according to examples of the present disclosure.

FIG. 2 is a simplified schematic diagram of an example lithography system 200, according to examples of the present disclosure. The lithography system 200 may also be referred to herein as a "scanner" that is operable to perform lithography exposing processes with respective radiation sources and exposure modes.

In one example, the lithography system 200 generally comprises a high-brightness light source 202, an illuminator 204, a mask stage 206, a photomask 208, a projection optics module 210, and a substrate stage 212. In some examples, the lithography system may include additional components that are not illustrated in FIG. 2, such as gas supply modules, exhaust modules, and/or other components. In further examples, one or more of the high-brightness light source 202, the illuminator 204, the mask stage 206, the photomask 208, the projection optics module 210, and the substrate stage 212 may be omitted from the lithography system 200 or may be integrated into combined components.

The high-brightness light source 202 may be configured to emit radiation having wavelengths in the range of approximately one nanometer to 250 nanometers. In one particular example, the high-brightness light source 202 generates EUV light with a wavelength centered at approximately 13.5 nanometers; accordingly, in some examples, the high-brightness light source 202 may also be referred to as an "EUV light source." However, it will be appreciated that the high-brightness light source 202 should not be limited to emitting EUV light. For instance, the high-brightness light source 202 may be utilized to perform any high-intensity photon emission from excited target material.

In one example, the term "approximately" is understood to mean +/−twenty percent of the stated value, and more typically +/−ten percent of the stated value, and more typically +/−five percent of the stated value, and more typically +/−three percent of the stated value, and more typically +/−two percent of the stated value, and more typically +/−one percent of the stated value, and even more typically +/−0.5 percent of the stated value. The stated value is therefore an approximate value. In the absence of any specific description, any stated value stated herein is approximate in accordance with the above definition.

In some examples (e.g., where the lithography system 200 is a UV lithography system), the illuminator 204 comprises various refractive optical components, such as a single lens or a lens system comprising multiple lenses (zone plates). In another example (e.g., where the lithography system 200 is an EUV lithography system), the illuminator 204 comprises various reflective optical components, such as a single mirror or a mirror system comprising multiple mirrors. The illuminator 204 may direct light from the high-brightness light source 202 onto the mask stage 206, and more particularly onto the photomask 208 that is secured onto the mask stage 206. Thus, the illuminator 204 focuses and shapes the radiation produced by the high-brightness illumination source 202 along the light path, in order to produce a desired illumination pattern upon the photomask 208.

In an example where the high-brightness light source 202 generates light in the EUV wavelength range, the illuminator 204 comprises reflective optics, such as a field facet mirror 218, a pupil facet mirror 220, and various relay mirrors (not shown). As discussed in further detail below, each of the field facet mirror 218 and the pupil facet mirror 220 may comprise a plurality of reflective facets (e.g., the field facet mirror may include a first plurality of reflective facets, while the pupil facet mirror may include a second plurality of reflective facets). Broadly, EUV radiation may be collected from the high-brightness light source 202 and focused as a beam onto the field facet mirror 218, where the facets of the field facet mirror split the beam into a plurality of light channels. The plurality of light channels is reflected toward corresponding facets of the pupil facet mirror 220, which forms images of the facets of the field facet mirror 218. The relay mirrors (e.g., conic relay mirrors) may subsequently direct the images of the facets of the field facet mirror onto the plane of the photomask 208.

The mask stage 206 may be configured to secure the photomask 208. In some examples, the mask stage 206 may include an electrostatic chuck (e-chuck) to secure the photomask 208. This is because the gas molecules absorb EUV light, and the lithography system 200 for EUV lithography patterning is maintained in a vacuum environment to minimize EUV intensity loss. Herein, the terms "photomask," "mask," and "reticle" may be used interchangeably. In one example, the photomask 208 is a reflective mask.

In some examples, the photomask 208 may comprise a reflective mask. One example structure of the photomask 208 includes a substrate formed from a suitable material, such as a low thermal expansion material (LTEM) or fused quartz. In various examples, the LTEM may include $TiO_2$, dopes $SiO_2$, or other suitable materials with low thermal expansion. The photomask 208 may further include a reflective multilayer deposited on the substrate.

The reflective multilayer may include a plurality of film pairs, such as molybdenum-silicon (Mo/Si) film pairs (e.g., a layer of molybdenum above or below a layer of silicon in each film pair) in certain examples. Alternatively, the reflective multilayer may include molybdenum-beryllium (Mo/Be) film pairs, or other suitable materials that are configurable to highly reflect the EUV light. The photomask 208 may further include a capping layer, such as a capping layer formed from ruthenium (Ru), disposed on the reflective multilayer for protection. The photomask 208 may further include an absorption layer, such as a tantalum boron nitride (TaBN) layer, deposited over the reflective multilayer. The absorption layer may be patterned to define a layer of an integrated circuit (IC). Alternatively, another reflective layer may be deposited over the reflective multilayer and may be patterned to define a layer of an integrated circuit, thereby forming an EUV phase shift mask.

In some examples, a pellicle 214 may be positioned over the photomask 208, e.g., between the photomask 208 and the substrate stage 212. The pellicle 214 may protect the photomask 208 from particles and may keep the particles out of focus, so that the particles do not produce an image (which may cause defects on a wafer during the lithography process).

The projection optics module 210 may be configured for imaging the pattern of the photomask 208 onto a semiconductor wafer 216 secured on the substrate stage 212, e.g., by projecting a patterned beam of radiation onto the semiconductor wafer 216. In one example, the projection optics module 210 comprises refractive optics (such as for a UV lithography system). In another example, the projection optics module 210 comprises reflective optics (such as for an EUV lithography system). The light directed from the photomask 208, carrying the image of the pattern defined on the photomask 208, may be collected by the projection optics module 210. The illuminator 204 and the projection optics module 210 may be collectively referred to as an "optical module" of the lithography system 200.

In some examples, the semiconductor wafer 216 may be a bulk semiconductor wafer. For instance, the semiconductor wafer 216 may comprise a silicon wafer. The semiconductor wafer 216 may include silicon or another elementary semiconductor material, such as germanium. In some examples, the semiconductor wafer 216 may include a compound semiconductor. The compound semiconductor may include gallium arsenide, silicon carbide, indium arsenide, indium phosphide, another suitable material, or a combination thereof. In yet another example, the semiconductor wafer 216 may include an alloy semiconductor, such as silicon germanium, silicon germanium carbide, gallium arsenic phosphide, or gallium indium phosphide. In other examples, the semiconductor wafer 216 may comprise a silicon-on-insulator (SOI) or a germanium-on-insulator (GOI) substrate. The SOI substrate may be fabricated using a separation by implantation of oxygen (SIMOX) process, a wafer bonding process, another applicable process, or a combination thereof.

In some examples, the semiconductor wafer 216 comprises an undoped substrate. However, in other examples, the semiconductor substrate 216 comprises a doped substrate, such as a p-type substrate or an n-type substrate.

In some examples, the semiconductor wafer 216 includes various doped regions (not shown) depending on the design requirements of the semiconductor device structure. The doped regions may include, for example, p-type wells and/or n-type wells. In some examples, the doped regions are doped with p-type dopants. For example, the doped regions may be doped with boron or boron fluoride. In other examples, the doped regions are doped with n-type dopants. For example, the doped regions may be doped with phosphor or arsenic. In some examples, some of the doped regions are p-doped and other doped regions are n-doped.

In some examples, an interconnection structure may be formed over the semiconductor wafer 216. The interconnection structure may include multiple interlayer dielectric layers, including dielectric layers. The interconnection structure may also include multiple conductive features formed in the interlayer dielectric layers. The conductive features may include conductive lines, conductive vias, and/or conductive contacts.

In some examples, various device elements are formed in the semiconductor wafer 216. Examples of the various device elements may include transistors (e.g., metal oxide semiconductor field effect transistors (MOSFETs), complementary metal oxide semiconductor (CMOS) transistors, bipolar junction transistors (BJTs), high-voltage transistors, high-frequency transistors, p-channel and/or n-channel field effect transistors (PFETs and/or NFETs), diodes, or other suitable elements. Various processes may be used to form the various device elements, including deposition, etching, implantation, photolithography, annealing, and/or other applicable processes.

The device elements may be interconnected through the interconnection structure over the semiconductor wafer 216 to form integrated circuit devices. The integrated circuit devices may include logic devices, memory devices (e.g., static random access memory (SRAM) devices), radio frequency (RF) devices, input/output (I/O) devices, system-on-chip (SoC) devices, image sensor devices, other applicable devices, or a combination thereof.

In some examples, the semiconductor wafer 216 may be coated with a resist layer that is sensitive to EUV light. Various components including those described above may be integrated together and may be operable to perform lithography exposing processes.

It will be appreciated that FIG. 2 represents a simplified form of a lithography system 200. In some examples, the lithography system 200 may include additional components that are not illustrated, such as additional optics, a plasma source, and other components.

Figure 3:
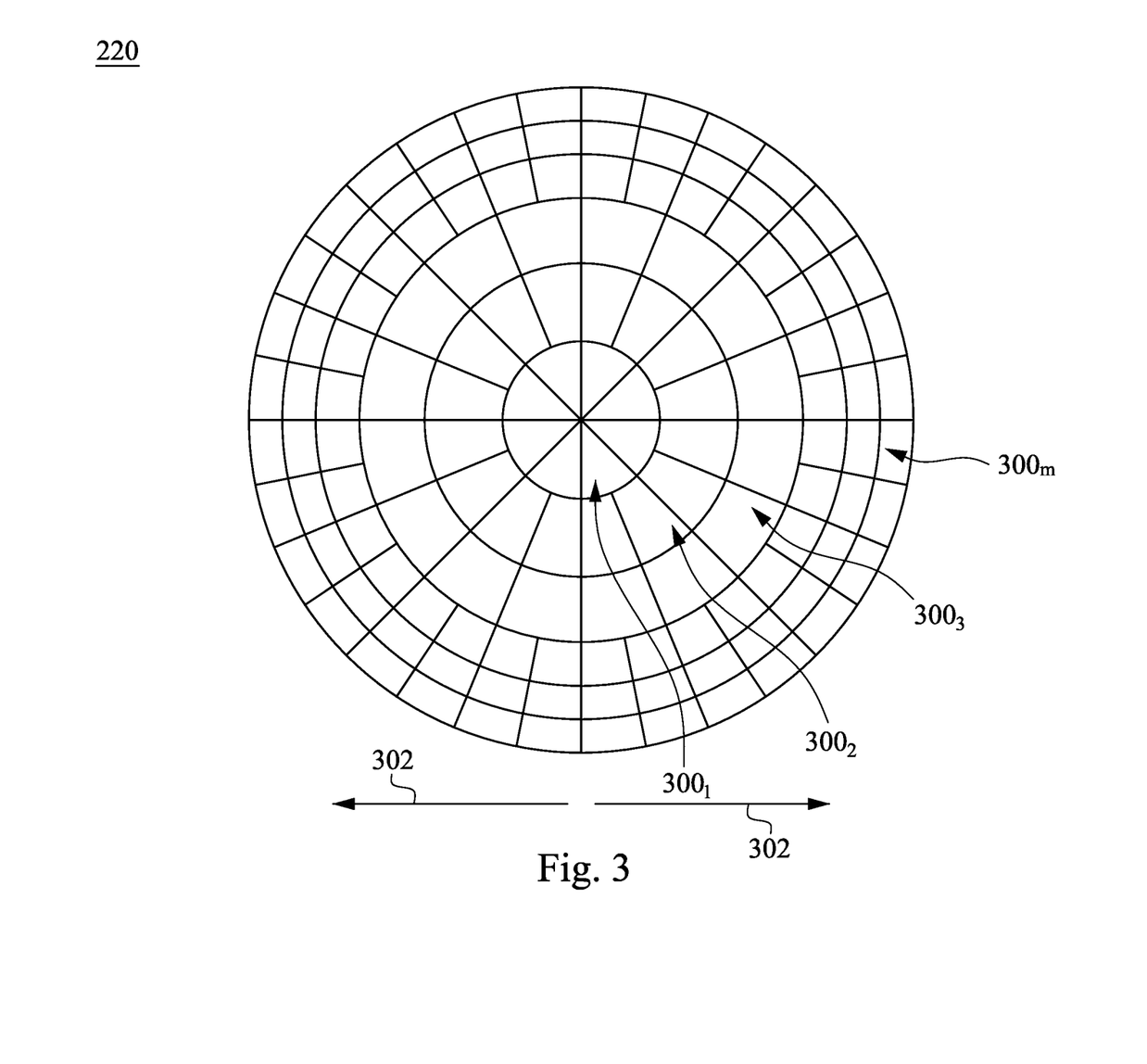
FIG. 3 is a top view of an example of the pupil facet mirror of FIG. 2, according to examples of the present disclosure.

FIG. 3 is a top view of an example of the pupil facet mirror 220 of FIG. 2, according to examples of the present disclosure. As illustrated, the pupil facet mirror may have a generally circular shape and may comprise a plurality of facets $300_1$-$300_m$ (hereinafter individually referred to as a "facet 300" or collectively referred to as "facets 300") arranged in the generally circular shape. It should be noted that for the sake of simplicity, only a few of the facets 300 are labeled in FIG. 3.

In some examples, the facets 300 are arranged in a grid pattern, as shown. Thus, the facets 300 may also be referred to as "cells" of the grid pattern. As shown in FIG. 3, the distribution of the facets 300 on the pupil facet mirror 220 may be non-uniform. More specifically, although the distribution of the facets 300 may be locally uniform over local areas of the pupil facet mirror 220 (e.g., facets 300 that are equidistant from the center of the pupil facet mirror 220 may be distributed in a uniform manner relative to each other), the distribution of the facets 300 is globally non-uniform (i.e., non-uniform over the entire surface of the pupil facet mirror 220). For instance, the density of the grid pattern may increase from the center of the grid pattern to the periphery of the grid pattern (e.g., along the directions of the arrows 302). Consequently, the sizes of the facets 300 may decrease from the center of the grid pattern to the periphery of the grid pattern. In other words, the facets 300 that are positioned around the periphery of the pupil facet mirror 220 (e.g., such as facet $300_m$ and its neighboring facets 300) may be smaller and more densely packed than the facets 300 that are positioned closer to the center of the pupil facet mirror 220 (e.g., such as facet $300_1$ and its neighboring facets 300).

The facets 300 may take any shape. Moreover, the shapes and/or dimensions of the facets 300 may vary over the area of the pupil facet mirror 220. That is, the facets 300 do not necessarily all have the same shape and/or dimensions. For instance, in the example illustrated in FIG. 3, the facets 300 closest to the center of the pupil facet mirror 220 (e.g., including facet $300_1$) are wedge-shaped; however, the facets 300 that are further away from the center of the pupil facet mirror 220 (e.g., including facets $300_2$-$300_m$) may be shaped more like curved polygons (e.g., rectangles, trapezoids, or the like). Moreover, the sizes and dimensions of these curved polygons may vary. For instance, the curved polygons of the facets 300 that are closest to the periphery of the pupil facet mirror 220 may be the smallest (i.e., have the smallest respective areas). Thus, the facets 300 may include facets of at least two different sizes and/or at least two different shapes. It should be noted that although the facets 300 are illustrated as having certain shapes and arrangements in FIG. 3, the facets 300 may be shaped and arranged in manners other than what is illustrated, as long as the distribution of the facets 300 is denser at the periphery of the pupil facet mirror 220 than at the center of the pupil facet mirror.

The arrangement of facets 300 on the pupil facet mirror 220 ensures greater illumination in the effective areas of a projection lens. This, in turn, allows greater illumination (e.g., a greater number of diffraction orders) to be collected in the effective areas (e.g., at the edges) of the projection lens, as described above. As a result of the greater illumination in the effective areas, features with smaller pitches may be resolved on a semiconductor wafer.

Figure 4:
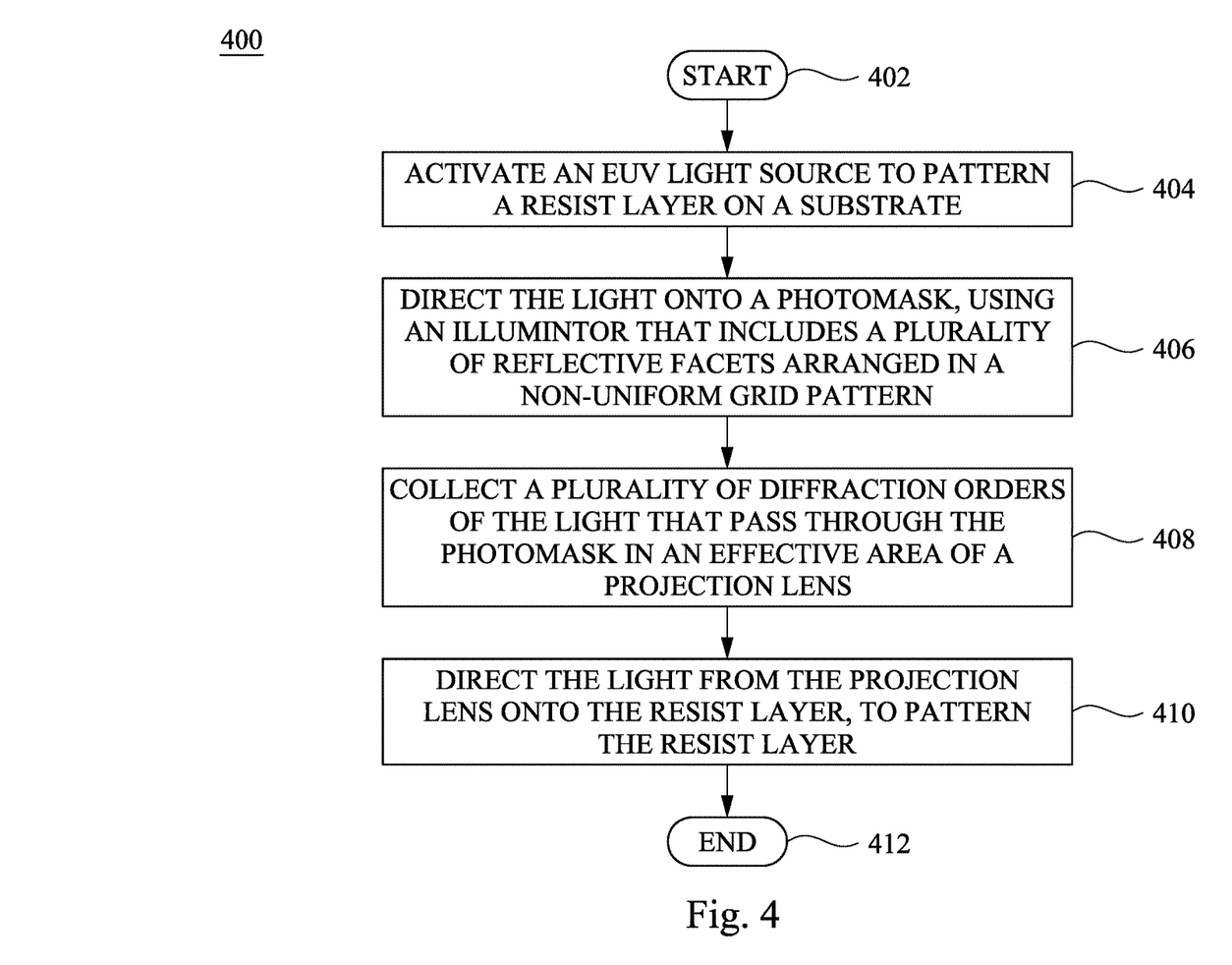
FIG. 4 illustrates a flowchart of a method of fabricating a semiconductor device according to at least one embodiment of the present disclosure.

FIG. 4 illustrates a flowchart of a method 400 of fabricating a semiconductor device according to at least one embodiment of the present disclosure. At least some steps of the method 400 may be performed via a controller of an EUV lithography system, such as the lithography system illustrated in FIG. 2.

While the method 400 is illustrated and described below as a series of acts or events, it will be appreciated that the illustrated ordering of such acts or events are not to be interpreted in a limiting sense. For example, some acts may occur in different orders and/or concurrently with other acts or events apparat from those illustrated and/or described herein. In addition, not all illustrated acts may be required to implement one or more aspects or embodiments of the description herein. Further, one or more of the acts depicted herein may be carried out in one or more separate acts and/or phases.

The method 400 begins in step 402. In step 404, an EUV light source may be activated to pattern a resist layer on a substrate (where the substrate may be a semiconductor wafer). For example, the EUV light source may be part of a lithography system such as the system illustrated in FIG. 2 and discussed above. Thus, the EUV light source may generate light in extreme ultraviolet wavelengths (potentially by vaporizing droplets of metal into a highly ionized plasma).

In step 406, light emitted by the EUV light source may be directed onto a photomask, using an illuminator that includes a plurality of reflective facets arranged in a non-uniform grid pattern. In one example, the plurality of reflective facets is arranged as a pupil facet mirror of the illuminator. In another example, the non-uniform grid pattern may vary such that the facets are distributed more densely at the periphery of the pupil facet mirror than at the center of the pupil facet mirror. For instance, the plurality of facets may be arranged as shown in FIG. 3. Direction of the light by the illuminator described above may cause the light to strike the surface of the photomask at oblique angles.

In step 408, a plurality of diffraction orders of the light that pass through the photomask may be collected by a projection lens in the effective areas of the projection lens. The effective areas of the projection lens may be defined relative to a target pitch for features to be printed on the substrate. For instance, as discussed above, the smaller the target pitch is, the smaller the corresponding effective area for printing the target pitch will be.

In step 410, the light may be directed from the projection lens onto the resist layer, to pattern the resist layer. For instance, exposure of the resist layer to the light may cause features having the target pitch to be printed in the resist.

In one embodiment, the blocks 404-410 may be continuously repeated during operation of the EUV light source (e.g., for multiple layers of the substrate). At block 412, the method 400 may end.

Thus, examples of the present disclosure enable features with very small pitches to be printed on semiconductor wafers by an EUV lithography system using a freeform source. In one example, the present disclosure provides an apparatus that includes an extreme ultraviolet illumination source and an illuminator. The extreme ultraviolet illumination source is arranged to generate a beam of extreme ultraviolet illumination to pattern a resist layer on a substrate. The illuminator is arranged to direct the beam of extreme ultraviolet illumination onto the surface of a photomask. In one example, the illuminator includes a field facet mirror and a pupil facet mirror. The field facet mirror includes a first plurality of facets arranged to split the beam of extreme ultraviolet illumination into a plurality of light channels. The pupil facet mirror includes a second plurality of facets arranged to direct the plurality of light channels onto a surface of the photomask. The distribution of the second plurality of facets is denser at a periphery of the pupil facet mirror than at a center of the pupil facet mirror.

In another example, an extreme ultraviolet light source is activated to pattern a resist layer on a substrate. Light emitted by the extreme ultraviolet light source is directed onto a photomask using an illuminator that includes a plurality of reflective facets arranged in a non-uniform grid pattern. A plurality of diffraction orders of the light that pass through the photomask are collected in an effective area of a projection lens. Light of the plurality of diffraction orders is then directed onto the resist layer.

In another example, the present disclosure provides an apparatus that includes a high-brightness light source, an illuminator, a photomask, and a projection lens. The high-brightness light source is arranged to generate illumination to pattern a resist layer on a substrate. The illuminator directs the illumination onto a surface of the photomask using a plurality of reflective facets arranged in a non-uniform grid pattern. The photomask generates a plurality of diffraction orders from the illumination. The projection lens collects at least some diffraction orders of the plurality of diffraction orders and focuses the at least some diffraction orders onto the resist layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus, comprising:
an extreme ultraviolet illumination source arranged to generate a beam of extreme ultraviolet illumination to pattern a resist layer on a substrate; and
an illuminator arranged to direct the beam of extreme ultraviolet illumination onto a surface of a photomask, wherein the illuminator comprises:
a field facet mirror comprising a first plurality of facets arranged to split the beam of extreme ultraviolet illumination into a plurality of light channels; and
a pupil facet mirror, comprising a second plurality of facets arranged to direct the plurality of light channels onto the surface of the photomask, and wherein a distribution of the second plurality of facets is denser at a periphery of the pupil facet mirror than at a center of the pupil facet mirror, the second plurality of facets comprises a first facet having a first size positioned at the periphery of the pupil facet mirror and a second facet having a second size positioned at the center of the pupil facet mirror, the first size is smaller than the second size, the first facet has two opposite linear edges both extending towards a center point of the pupil facet mirror, the second facet has an arc edge with two ends, one of the two opposite linear edges of the first facet further extends towards a portion of the arc edge of the second facet between the two ends of the arc edge, and another one of the two opposite linear edges of the first facet is substantially aligned with a linear edge of the second facet positioned at the center of the pupil facet mirror.

2. The apparatus of claim 1, further comprising:
the photomask, wherein the photomask comprises a grating to split each light channel of the plurality of light channels into a plurality of diffraction orders; and
a projection lens to collect at least some diffraction orders of the plurality of diffraction orders and to focus the at least some diffraction orders onto the resist layer.

3. The apparatus of claim 2, wherein the second plurality of facets is arranged to direct the plurality of light channels so that at least some light channels of the plurality of light channels are incident on the surface of the photomask at an angle that is oblique relative to the surface of the photomask.

4. The apparatus of claim 1, wherein the pupil facet mirror has a circular shape.

5. The apparatus of claim 1, wherein the first and second facets have different shapes.

6. The apparatus of claim 1, wherein the first facet is positioned at an outermost position of the periphery of the pupil facet mirror, the second plurality of facets further comprises a third facet positioned between the first and second facets, and the third facet has a size larger than the first facet and smaller than the second facet.

7. A method, comprising:
activating an extreme ultraviolet light source to pattern a resist layer on a substrate;
directing light emitted by the extreme ultraviolet light source onto a photomask using an illuminator that includes a plurality of reflective facets arranged in a non-uniform grid pattern, the non-uniform grid pattern comprises a plurality of cells, and each cell of the plurality of cells corresponds to a facet of the plurality of reflective facets, wherein a first cell and a second cell of the plurality of cells are positioned at a periphery of the non-uniform grid pattern, a third cell of the plurality of cells is positioned at a center of the non-uniform grid pattern, a first edge of the first cell, a second edge of the second cell, and a third edge of the third cell are substantially coterminous, a fourth edge of the first cell, a fifth edge of the second cell, and a sixth edge of the third cell are offset from each other, the first edge of the first cell is opposite to the fourth edge of the first cell, the second edge of the second cell is opposite to the fifth edge of the second cell, and the third edge of the third cell is opposite to the sixth edge of the third cell;

collecting a plurality of diffraction orders of the light that pass through the photomask in an effective area of a projection lens; and directing light of the plurality of diffraction orders onto the resist layer.

8. The method of claim 7, wherein a distribution of the plurality of cells is denser at the periphery of the non-uniform grid pattern than at the center of the non-uniform grid pattern.

9. The method of claim 7, wherein the non-uniform grid pattern has a circular shape.

10. The method of claim 7, wherein the first and third cells have different sizes.

11. The method of claim 7, wherein the first and third cells have different shapes.

12. The method of claim 7, wherein the directing the light onto the photomask comprises directing the light so that at least some beams of the light are incident on a surface of the photomask at an angle that is oblique relative to the surface of the photomask.

13. The method of claim 7, wherein the plurality of cells are arranged to be a plurality of rings.

14. The method of claim 7, wherein a size of the second cell is larger than a size of the first cell and smaller than a size of the third cell.

15. An apparatus, comprising:
a light source arranged to generate illumination to pattern a resist layer on a substrate;
a photomask to generate a plurality of diffraction orders from the illumination;
an illuminator to direct the illumination onto a surface of the photomask using a plurality of reflective facets arranged in a non-uniform grid pattern, wherein the non-uniform grid pattern comprises a plurality of cells, and each cell of the plurality of cells corresponds to a facet of the plurality of reflective facets, a first cell of the plurality of cells at a center of the non-uniform grid pattern is sector-shaped, and a second cell of the plurality of cells at a periphery of the non-uniform grid pattern has an arc edge shorter than an arc edge of the first cell; and
a projection lens to collect at least some diffraction orders of the plurality of diffraction orders and to focus the at least some diffraction orders onto the resist layer.

16. The apparatus of claim 15, wherein the plurality of cells includes cells of at least two different shapes.

17. The apparatus of claim 15, wherein the light source is an extreme ultraviolet light source.

18. The apparatus of claim 15, wherein the plurality of reflective facets is arranged to direct the illumination so that at least some of the illumination is incident on the surface of the photomask at an angle that is oblique relative to the surface of the photomask.

19. The apparatus of claim 15, wherein the second cell of the plurality of cells is a curved polygon.

20. The apparatus of claim 15, wherein the first cell has two opposite first linear edges, a third cell of the plurality of cells has a size the same as a size of the second cell, the first cell, the second cell, and the third cell are adjacent to each other, wherein the second cell has a second linear edge aligned to one of the two opposite first linear edges of the first cell, and the third cell has a third linear edge aligned to another one of the two opposite first linear edges of the first cell.

* * * * *